(12) United States Patent
Darbari et al.

(10) Patent No.: US 12,050,849 B2
(45) Date of Patent: Jul. 30, 2024

(54) LIVELOCK DETECTION IN A HARDWARE DESIGN USING FORMAL EVALUATION LOGIC

(71) Applicant: Imagination Technologies Limited, Kings Langley (GB)

(72) Inventors: Ashish Darbari, Abbots Langley (GB); Iain Singleton, Hemel Hempstead (GB)

(73) Assignee: Imagination Technologies Limited, Kings Langley (GB)

( * ) Notice: Subject to any disclaimer, the term of this patent is extended or adjusted under 35 U.S.C. 154(b) by 30 days.

(21) Appl. No.: 17/749,054

(22) Filed: May 19, 2022

(65) Prior Publication Data

US 2022/0277124 A1    Sep. 1, 2022

Related U.S. Application Data

(60) Division of application No. 17/133,294, filed on Dec. 23, 2020, now Pat. No. 11,373,025, which is a
(Continued)

(30) Foreign Application Priority Data

Jun. 20, 2016 (GB) ..................................... 1610736

(51) Int. Cl.
  *G06F 30/3323*  (2020.01)
  *G06F 9/30*  (2018.01)
  (Continued)

(52) U.S. Cl.
  CPC ...... *G06F 30/3323* (2020.01); *G06F 9/30145* (2013.01); *G06F 9/3802* (2013.01);
  (Continued)

(58) Field of Classification Search
  USPC .......................................................... 716/106
  See application file for complete search history.

(56) References Cited

U.S. PATENT DOCUMENTS

| 6,553,514 B1 | 4/2003 | Baumgartner et al. |
| 2006/0064695 A1* | 3/2006 | Burns .................. G06F 9/3851 |
| | | 718/100 |

(Continued)

FOREIGN PATENT DOCUMENTS

| EP | 3168746 A1 | 5/2017 |
| GB | 2526052 A | 11/2015 |

OTHER PUBLICATIONS

Beu et al., "High-Speed Formal Verification of Heterogeneous Coherence Hierarchies," 2013 IEEE 19th International Symposium on High Performance Computer Architecture, Feb. 2013.
(Continued)

*Primary Examiner* — Bryce M Aisaka
(74) *Attorney, Agent, or Firm* — Potomac Law Group, PLLC; Vincent M DeLuca

(57) ABSTRACT

A hardware monitor arranged to detect livelock in a hardware design for an integrated circuit. The hardware monitor includes monitor and detection logic configured to detect when a particular state has occurred in an instantiation of the hardware design; and assertion evaluation logic configured to periodically evaluate one or more assertions that assert a formal property related to reoccurrence of the particular state in the instantiation of the hardware design to detect whether the instantiation of the hardware design is in a livelock comprising the predetermined state. The hardware monitor may be used by a formal verification tool to exhaustively verify that the instantiation of the hardware design cannot enter a livelock comprising the predetermined state.

9 Claims, 10 Drawing Sheets

Related U.S. Application Data continuation of application No. 16/419,734, filed on May 22, 2019, now Pat. No. 10,909,289, which is a continuation of application No. 15/340,638, filed on Nov. 1, 2016, now Pat. No. 10,346,571.

(51) Int. Cl.
| | | |
|---|---|---|
| *G06F 9/38* | (2018.01) | |
| *G06F 11/07* | (2006.01) | |
| *G06F 11/30* | (2006.01) | |
| *G06F 30/33* | (2020.01) | |
| *G06F 30/333* | (2020.01) | |

(52) U.S. Cl.
CPC ........ *G06F 11/076* (2013.01); *G06F 11/3055* (2013.01); *G06F 30/33* (2020.01); *G06F 30/333* (2020.01)

(56) References Cited

U.S. PATENT DOCUMENTS

| | | |
|---|---|---|
| 2007/0245129 A1 | 10/2007 | Abernathy et al. |
| 2008/0228974 A1 | 9/2008 | Johns et al. |
| 2008/0301374 A1 | 12/2008 | Hall et al. |
| 2012/0198397 A1 | 8/2012 | Moon et al. |
| 2014/0089931 A1* | 3/2014 | Burns ....................... G06F 1/28 |
| | | 718/103 |

OTHER PUBLICATIONS

NOTE: NPL in parent apn).

* cited by examiner

LIVELOCK DETECTION IN A HARDWARE DESIGN USING FORMAL EVALUATION LOGIC

CROSS-REFERENCE TO RELATED APPLICATIONS AND CLAIM OF PRIORITY

This application is a division under 35 U.S.C. 121 of copending application Ser. No. 17/133,294 filed Dec. 23, 2020, which is a continuation under 35 U.S.C. 120 of prior application Ser. No. 16/419,734 filed May 22, 2019, now U.S. Pat. No. 10,909,299, which is a continuation of prior application Ser. No. 15/340,638 filed Nov. 1, 2016, now U.S. Pat. No. 10,346,571, which claims foreign priority under 35 U.S.C. 119 from United Kingdom Application No. 1610736.9 filed Jun. 20, 2016, the disclosures of which are incorporated herein by reference in their entireties.

BACKGROUND

Hardware designs for integrated circuits, such as designs for system-on-chips (SoCs), typically implement one or more complex finite state machines (FSMs) which transition between states in response to input events in the hardware design and/or based on a computation on the internal state of the FSM.

The interplay between input events and computations based on the internal state of the FSM often results in dependencies, hazards and race conditions resulting in the FSM being in a livelock or a deadlock. A FSM is in deadlock if it has reached a state where no combination of inputs, or combination of internal state interactions, will cause the state to be exited (i.e. it is not possible to transition out of the state). In contrast, a FSM is in livelock if it can transition between states (i.e. it is not stuck in a single state as with deadlock), but it infinitely cycles through the same set of sets. For example, a FSM that infinitely cycles through three states A, B and C (e.g. A→B→C→A→B→C . . . ) is said to be in livelock.

Since it can be costly to discover, only after the hardware design is implemented in hardware (e.g. silicon), that it is prone to livelock, it is beneficial to identify livelock in a hardware design prior to implementing the hardware design in hardware.

The embodiments described below are provided by way of example only and are not limiting of implementations which solve any or all of the disadvantages of known methods and systems for detecting livelock in a hardware design.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Described herein are hardware monitors arranged to detect livelock in a hardware design for an integrated circuit. The hardware monitors include monitor and detection logic configured to detect when a particular state has occurred in an instantiation of the hardware design; and assertion evaluation logic configured to periodically evaluate one or more assertions that assert a formal property related to reoccurrence of the particular state in the instantiation of the hardware design to detect whether the instantiation of the hardware design is in a livelock comprising the predetermined state. The hardware monitor may be used by a formal verification tool to exhaustively verify that the instantiation of the hardware design cannot enter a livelock comprising the predetermined state.

A first aspect provides a hardware monitor arranged to detect livelock in a hardware design for an integrated circuit, the hardware monitor comprising: monitor and detection logic configured to detect when a particular state has occurred in an instantiation of the hardware design; and assertion evaluation logic configured to periodically evaluate one or more assertions that assert a formal property related to reoccurrence of the particular state in the instantiation of the hardware design to determine whether the instantiation of the hardware design is in a livelock comprising the predetermined state.

A second aspect provides a method of detecting livelock in a hardware design for an integrated circuit, the method comprising: receiving the hardware design and a hardware monitor according to the first aspect; formally verifying, using a formal verification tool, the one or more formal assertions are true for the hardware design; and outputting an indication of whether or not each of the one or more formal assertions was successfully verified to identify whether an instantiation of the hardware design can enter a livelock that includes the particular state.

A third aspect provides a system configured to detect livelock in a hardware design for an integrated circuit, the system comprising: a memory configured to store: the hardware design; a formal verification tool; and the hardware monitor of the first aspect; one or more processors configured to: formally verify, using the formal verification tool, that the one or more formal assertions are true for the hardware design; and output an indication of whether or not each of the one or more formal assertions was successfully verified to identify whether an instantiation of the hardware design can enter a livelock that includes the particular state.

A fourth aspect provides computer readable code adapted to perform the steps of the method of the second aspect when the code is run on a computer.

A fifth aspect provides computer readable storage medium having encoded thereon the computer readable code of the fourth aspect.

There may be provided computer program code for performing a method as described herein. There may be provided non-transitory computer readable storage medium having stored thereon computer readable instructions that, when executed at a computer system, cause the computer system to perform the method as described herein.

The above features may be combined as appropriate, as would be apparent to a skilled person, and may be combined with any of the aspects of the examples described herein.

BRIEF DESCRIPTION OF THE DRAWINGS

Examples will now be described, by way of example, with reference to the following drawings, in which.

Figure 1:
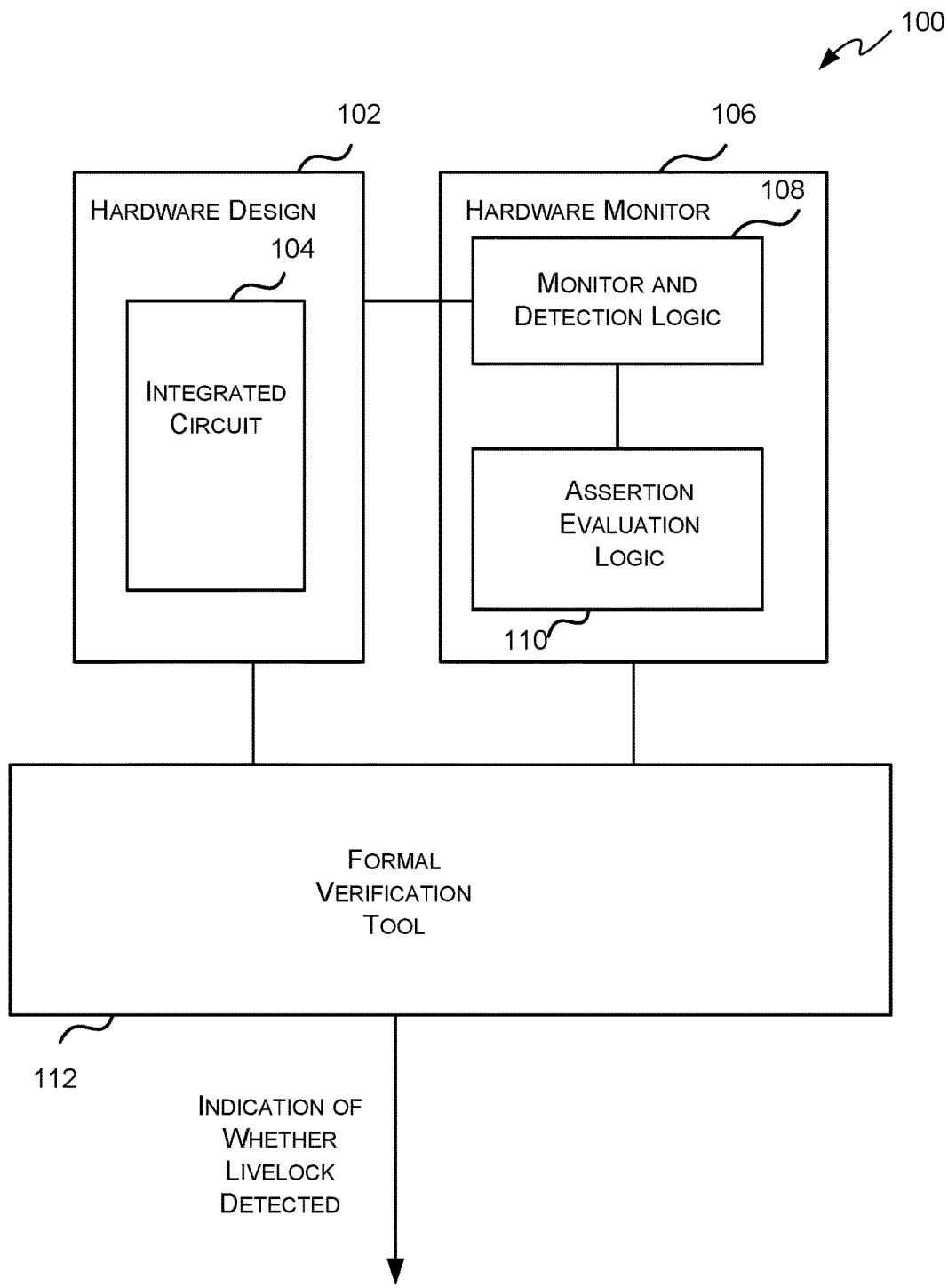
FIG. 1 is a block diagram of an example system for detecting livelock in a hardware design using formal.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

As described above, the interplay between input events and computations based on the internal state of a FSM often results in dependencies, hazards and race conditions resulting in the FSM being in a livelock or a deadlock. A FSM is in deadlock if it has reached at state where no combination of inputs, or combination of internal state interactions will cause the state to be exited (i.e. it is not possible to transition out of the state). In contrast, a FSM is in livelock if can transition between states (i.e. it is not stuck in a single state as with deadlock), but it infinitely cycles through the same set of sets. For example, a FSM that infinitely cycles through three states A, B and C (e.g. A→B→C→A→B→C . . . ) is said to be in livelock.

Livelock is more difficult to detect in a hardware design than deadlock because to detect deadlock one must only detect that an instantiation of the hardware design remains in the same state indefinitely whereas to detect livelock one must detect reoccurrence of a state or a set of states. Furthermore there are typically only a handful of input transaction sequences which will cause livelock. This makes it very difficult to detect livelock using simulation-based verification which requires providing input stimuli to the instantiation of the hardware design and analysing the output in response to the input stimuli.

Embodiments described herein relate to methods, systems and hardware monitors for detecting livelock in a hardware design using formal. The methods include detecting the occurrence of a particular state in an instantiation of the hardware design; and evaluating one or more formal assertions that assert a formal property related to the recurrence of the particular state to determine whether the instantiation of the hardware design is in a livelock. A formal verification tool can then be used to formally verify that the one or more formal assertions are true for all valid sequences of states of the hardware design to exhaustively verify that an instantiation of the hardware design will not enter into a livelock that includes the particular state.

In formal verification, the hardware design is transformed into a mathematical model (e.g. a state-transition system) and the properties to be verified are expressed using mathematical logic using a precise syntax or a language with a precise mathematical syntax and semantics. A property is then verified by searching the entire reachable state space of the hardware design without explicitly traversing the state machine. Since formal verification algorithmically and exhaustively explores all input values over time, verifying properties in this manner allows a property to be exhaustively proved or disproved for all valid states. In the embodiments described herein the formal verification of the assertion(s) allows exhaustive verification that an instantiation of the hardware design will not enter livelock that includes a particular state.

Accordingly using the methods, systems and hardware monitors described herein to verify that an instantiation of a hardware design will not enter livelock including a particular state allow all of the relevant stimulus, or inputs, to be tested in a quick and efficient manner. As described above, since in many cases only a handful of input transaction sequences will cause livelock including a particular state, the methods, systems and hardware monitors described herein allow identification of input transaction sequences that may cause livelock including the particular state that would be difficult, if not impossible, to identify using simulation-based methods. Accordingly, the methods, systems and hardware monitors described herein are particularly effective in identifying very specific or obscure interactions that cause livelock.

Reference is now made to FIG. 1 which illustrates an example system 100 for detecting livelock in a hardware design using formal. The system 100 comprises a hardware design 102 that describes an integrated circuit 104; a hardware monitor 106 comprising monitor and detection logic 108 configured to detect when a particular state has occurred in an instantiation of the hardware design 102, and assertion evaluation logic 110 configured to evaluate one or more assertions that assert a property related to the recurrence of the particular state in the instantiation of the hardware design 102 to determine whether the instantiation of the hardware design 102 is in a livelock; and a formal verification tool 112 configured to use the hardware monitor 106 to exhaustively verify that the instantiation of the hardware design 102 will not enter into a livelock that includes the particular state.

The term "hardware design" is used herein to refer to a description of an integrated circuit 104 for all or part of an electronic system (e.g. a processor) which can be used to generate a hardware manifestation of the integrated circuit (e.g. the hardware design may be synthesised into silicon or used to program a field-programmable gate array (FPGA)). The hardware design may relate to a module, block, unit, sub-system, system or any combination thereof of an electronic system (e.g. processor).

The hardware design 102 may be implemented in a high level hardware description language (HDL), such as, but not limited to, a register transfer level (RTL) language.

Examples of register transfer level languages include, but are not limited to, VHDL (VHS IC Hardware Description Language) and Verilog. It will be evident to a person of skill in the art that other high level hardware description languages may be used such as proprietary high level hardware description languages.

An "instantiation of the hardware design" refers to a representation of the hardware defined by the hardware design. An instantiation of the hardware design embodies the hardware design in a form which can be tested to verify the hardware design. An instantiation of a hardware design includes, but is not limited to, a synthesized version of the hardware design, a hardware implementation of the hardware design (e.g. an integrated circuit made according to the hardware design), and the mathematical model (e.g. a state-transition system) generated by a formal verification tool.

The hardware monitor 106 is a module configured to monitor the operation of an instantiation of the hardware design 102 to detect when the particular state occurs in the instantiation of the hardware design 102; and, evaluate one or more assertions that assert a property related to the recurrence of the particular state in the instantiation of the hardware design 102 to detect whether the instantiation of the hardware design 102 is in livelock including the particular state.

In the example of FIG. 1, the hardware monitor 106 comprises monitor and detection logic 108 and assertion evaluation logic 110. The monitor and detection logic 108 is configured to monitor one or more control signals and/or data signals of an instantiation of the hardware design 102 to detect when the instantiation of the hardware design 102 is in a particular state. The specific control signals and/or data signals that are monitored and the configuration thereof that indicate the instantiation of the hardware design 102 is in a particular state depends on the particular state that is being monitored and the configuration of the instantiation of the hardware design 102. Example implementations of the monitor and detection logic 108 will be described with reference to FIGS. 3, 5 and 7.

The assertion evaluation logic 110 is configured to evaluate one or more formal assertions that assert a formal property related to the recurrence of the particular state in the instantiation of the hardware design 102 to determine whether the instantiation of the hardware design 102 is in a livelock that includes the particular state.

As is known to those of skill in the art, a formal property is a statement or expression that captures design behavior. For example, a simple formal property may be a=b. Within HDL designs, a formal property is an executable statement that checks for specific behavior within the HDL design. For example, if a design contains a FIFO (first in first out) buffer a formal property may be that neither overflow nor underflow of the FIFO may occur.

Formal properties are used to capture required or desired temporal behavior of an instantiation of the hardware design in a formal and unambiguous way. The hardware design can then be verified to determine that it conforms to the required or desired behavior as captured by one or more properties.

Formal properties are typically written in an assertion language. An assertion language, which also may be referred to as a property language, captures the design behavior over multiple design cycles in a concise, unambiguous manner. While traditional hardware description languages (HDL), such as VHDL or Verilog RTL, have the ability to capture individual cycle behavior, they are too detailed to describe properties at a higher level. In particular, assertion languages provide means to express temporal relationships and complex design behaviors in a concise manner. Assertion languages include, but are not limited to, SystemVerilog Assertions (SVA), Property Specification Language (PSL), Incisive® Assertion Library (IAL), Synopsys® OpenVera™ Assertions (OVA), Symbolic Trajectory Evaluation (STE), Hardware Property Language (HPL), 0-In®, and Open Verification Library (OVL).

A formal property may be asserted or covered. When a formal property is asserted it must always be true. In contrast, when a property is covered the property must be true at least once, but is not required to be true always. An asserted property is said to form an assertion. An example assertion of the property a=b is assert property (a=b). Similarly a covered property is said to form a cover. An example cover of the property a=b is cover property (a=b).

Formal properties are typically 'clocked', meaning that that they are only evaluated upon a clock event occurring (e.g. upon the positive edge of a clock signal or the negative edge of a clock signal). Accordingly, assertions or covers generally indicate which clock and which clock edge triggers evaluation of the formal property. An example SVA assertion of the formal property a=b is as follows:

assert (@(posedge clk) property (a==b));

It will be evident to a person of skill in the art that in the example SVA assertion above the formal property a==b will be evaluated on the positive edge (posedge) of the clock signal (clk).

In the system of FIG. 1 the assertion evaluation logic 110 is configured to evaluate at least one assertion that asserts a property related to the recurrence of the particular state in an instantiation of the hardware design to verify that the instantiation of the hardware design is not in a livelock that includes the particular state. A property related to the recurrence of the particular state in the instantiation of the hardware design is any property that relates to the particular state occurring in the instantiation of the hardware design two or more points in time. The specific property that is asserted is dependent on the particular state being monitored and a valid or acceptable recurrence parameter defined in the specification for the hardware design 102.

For example, the specification for the hardware design 102 may define that if a particular state, s, occurs in an instantiation of the hardware design 102 that the particular state s cannot occur in the instantiation of the hardware design 102 again in the following N clock cycles. In other words if the particular state s occurs in the instantiation of the hardware design 102 twice within N clock cycles then the instantiation of the hardware design 102 may be in livelock because it has returned to the particular state s too soon. In this example, the assertion evaluated by the assertion evaluation logic 110 may assert that if the state s has occurred in the instantiation of the hardware design then the state s cannot occur in the instantiation of the hardware design 102 in the following N clock cycles.

In another example, where the integrated circuit 104 forms a processor, the specification for the hardware design 102 may define that if the processor fetches an instruction from a particular address it cannot fetch an instruction from the same address within a predetermined number of clock cycles. In this example, the monitor and detection logic 108 may be configured to detect when the processor is fetching an instruction with the particular address; and the assertion evaluation logic 110 may be configured to evaluate an assertion that states or asserts that if the processor fetches an instruction from a particular address the processor cannot fetch an instruction from the same address within the predetermined number of clock cycles.

In yet another example, the specification for the hardware design 102 may specify that between a start event and a stop event an instantiation of the hardware design 102 cannot be in a particular state more than X times. In this example, the monitor and detection logic 108 may be configured to detect the start event, stop event, and to count the number of times the particular state occurs in the instantiation of the hardware design between the start event and the stop event; and the assertion evaluation logic 110 may be configured to evaluate an assertion that states or asserts that the count is less than X.

It will be evident to a person of skill in the art that these are examples only and other assertions related to the recurrence of a particular state in an instantiation of the hardware design 102 may be used to detect livelock in the instantiation of the hardware design 102.

The hardware monitor 106 may be implemented in software. For example, the hardware monitor 106 may be implemented using a hardware description language (HDL) or an assertion language (e.g. System Verilog Assertions (SVA)).

The hardware monitor 106 is bound to the hardware design 102 to monitor the state of the hardware design 102 to detect a possible livelock. Where the hardware monitor 106 is implemented in SVA and the hardware design 102 is implemented in RTL, the SVA code is bound to the RTL code.

The hardware design 102 (e.g. RTL), hardware monitor 106 (e.g. SVA), and bindings, are loaded into a formal verification tool 112. The formal verification tool 112 is a software tool that is capable of performing formal verification of a hardware design. Examples of formal verification tools include, but are not limited to, Mentor Graphics Questa® Formal Verification, Synopsys VC Formal, Cadence® Incisive® Enterprise Verifier, JasperGold®, and OneSpin 360 DV™.

Formal verification is a systematic process that uses mathematical reasoning to verify a property in a hardware design. Formal verification can be contrasted to simulation-based verification in which a hardware design is tested by applying stimuli to an instantiation of the hardware design and monitoring the output of the instantiation of the hardware design in response to the stimuli.

In formal verification the hardware design (e.g. hardware design 102) is transformed into a mathematical model (e.g. a state-transition system) to thereby provide an instantiation of the hardware which can be tested to verify the hardware design, and the formal properties (e.g. those evaluated by the assertion evaluation logic 110) are expressed using mathematical logic using a precise syntax or a language with a precise mathematical syntax and semantics.

A formal property is verified by searching the entire reachable state space of the instantiation of the hardware design (e.g. state transition system) without explicitly traversing the state machine. The search is done by, for example, encoding the states using efficient Boolean encodings using Binary decision diagrams (BDDS), or using advanced SAT (satisfiability-based bounded model checking) based techniques. In some cases tools can be used to implement techniques, such as, but not limited to, abstraction, symmetry, symbolic indexing, and invariants to improve performance and achieve scalability.

A formal property that is covered is verified by searching the reachable state space of the instantiation of the hardware design (e.g. state transition system) for at least one valid state in which the property is true. Once a valid state is found in which the property is true then the searching ceases. In contrast, a formal property that is asserted is verified by confirming the property is true for all valid states (as defined by formal constraints). In other words, an asserted property is verified by searching the reachable state space of the instantiation of the hardware design for a valid state in which the property is not true. Since formal verification of an asserted property algorithmically and exhaustively explores all valid input values over time, verifying an asserted property in this manner allows a property to be exhaustively proved or disproved for all valid states.

When the formal verification tool 112 is used to verify an assertion, the formal verification tool 112 may output an indication of whether or not the assertion is valid (i.e. is true for all valid states or sequence of states), which may also be referred to herein as the assertion being successfully verified. The output may be yes the assertion is valid or has been successfully verified; no the assertion is not valid (i.e. it is not true or has failed for at least one valid state or sequence of states) or has not been successfully verified; or the formal verification was inconclusive. The formal verification may be inconclusive, for example, because the computing-based device running the formal verification tool 112 has run out of memory or because the formal verification tool 112 has determined that a certain amount of progress has not been made after a predefined period of time.

Where an assertion is not valid or has not been successfully verified, the formal verification tool 112 may also output information indicating a state or sequence of states of the instantiation of the hardware design 102 which causes the assertion to fail. For example, the formal verification tool 112 may output a trace of the verification indicating at what point, state or sequence of states the failure occurred.

Figure 2:
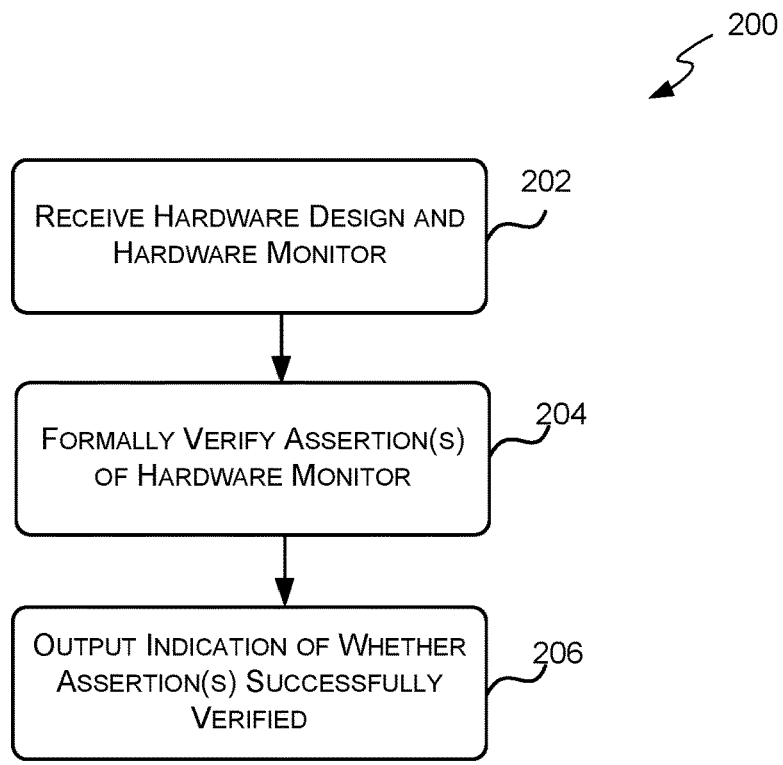
FIG. 2 is a flow diagram of an example method for detecting livelock in a hardware design using the system of FIG. 1.

Reference is now made to FIG. 2 which illustrates a flow diagram of an example method 200 for exhaustively verifying that a hardware design will not enter livelock that includes a particular state. The method 200 may be implemented on a computing-based device, such as the computing-based device 900 described below with reference to FIG. 9.

The method 200 begins at block 202 where the hardware design 102 and the hardware monitor 106 are received at the computing-based device 900. As described above, the hardware design 102 defines an integrated circuit for all or part of an electronic system (e.g. processor); and the hardware monitor 106 is configured to detect when the particular state has occurred in an instantiation of the hardware design 102, and evaluate one or more assertions that assert a property related to the recurrence of the particular state in the instantiation of the hardware design 102 to determine if the instantiation of the hardware design 102 is in livelock.

Once the hardware design 102 and the hardware monitor 106 have been received the method 200 proceeds to block 204.

At block 204, the formal verification tool 112, formally verifies the assertion(s) defined in the hardware monitor 106 for the instantiation of the hardware design 102. In this case the instantiation of the hardware design 102 is the mathematical model (e.g. a state-transition system) generated by the formal verification tool 112. Formally verifying an assertion comprises verifying that for all valid sequences of states of the instantiation of the hardware design 102 (as defined by formal constraints) that the property is true. For example, verifying an assertion that if the hardware monitor is in state s that it is not in state s in the next N clock cycles comprises determining whether there is a valid sequence of states for the instantiation of the hardware design 102 in which the instantiation of the hardware design is in state s at least twice within N clock cycles.

Once the formal verification ends the method 200 proceeds to block 206.

At block 206, the formal verification tool 112 outputs an indication of whether the assertion(s) were successfully verified or not. This indication identifies whether the instantiation of the hardware design 102 can enter a livelock that includes the particular state. Specifically, if the assertion(s) have been formally verified (i.e. the assertions are true for all valid sequences of states of the instantiation of the hardware design 102) then it has been exhaustively verified that the instantiation of the hardware design will not enter a livelock that comprises the particular state. If, however, the assertions were not formally verified (i.e. there is at least one sequence of states in which an assertion is not true) then it is possible that the instantiation of the hardware design 102 may enter a livelock that includes the particular state.

Where an asserted property has not been successfully verified the formal verification tool 112 may also output an indication of a sequence of states of the instantiation of the hardware design in which the assertion is not true. The indication of the sequence of states of the instantiation of the hardware design in which the assertion is not true may be used by an engineer or designer to modify the hardware design to avoid the potential livelock.

In particular, once the verification is complete the hardware design 102 may be modified based on the outcome of the verification (e.g. the information output by the formal verification tool 112). For example, if the verification identifies that an instantiation of the hardware design 102 may enter livelock the hardware design 102 may be modified to correct its operation. The modified hardware design may then be re-verified, and once verified that an instantiation of the modified hardware design does not enter livelock the modified hardware design may be implemented in hardware to generate an integrated circuit as described with reference to FIG. 10.

Figure 3:
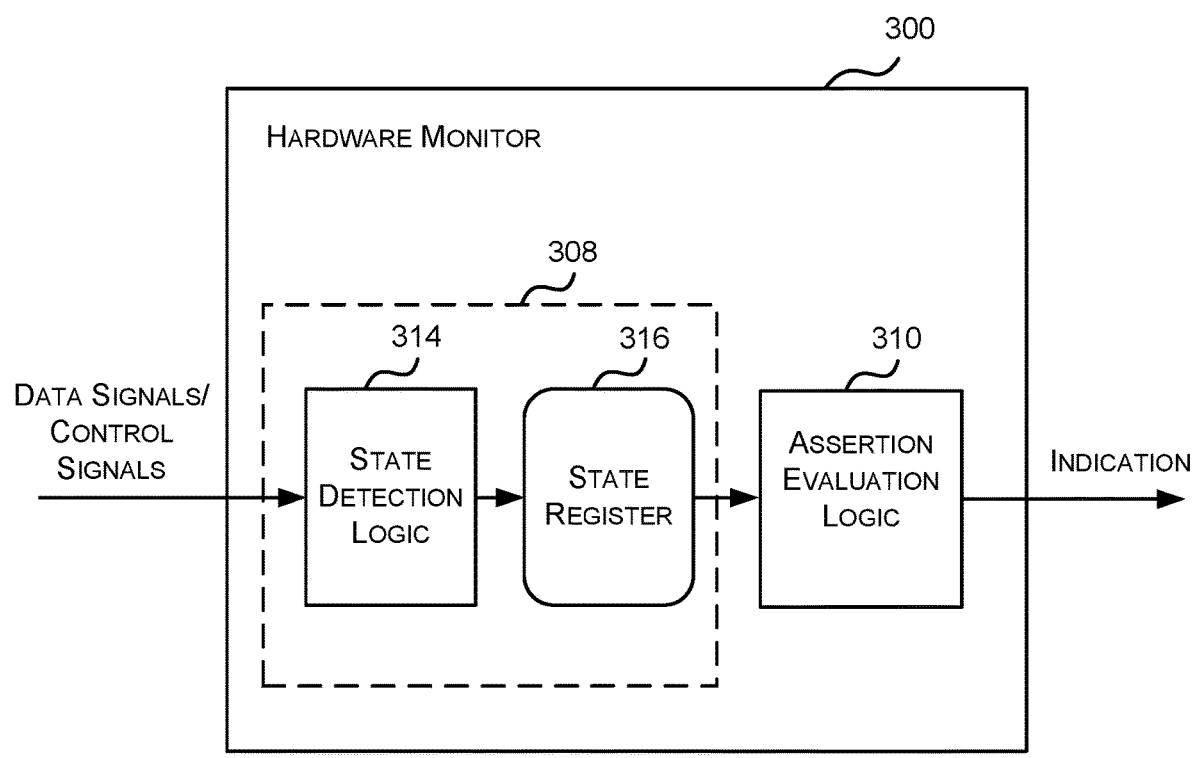
FIG. 3 is a block diagram of a first example implementation of the hardware monitor of FIG. 1 for detecting livelock in a hardware design.

Reference is now made to FIG. 3 which illustrates a first example implementation of a hardware monitor 300, which may be used as hardware monitor 106 of FIG. 1, for detecting livelock in a hardware design 102. The hardware monitor 300 of FIG. 3 detects livelock in a hardware design 102 by detecting whether an instantiation of the hardware design 102 loops back to a particular state within a predetermined number of clock cycles.

The hardware monitor 300 comprises monitor and detection logic 308 for detecting when the particular state occurs in the instantiation of the hardware design 102; and assertion evaluation logic 310 for evaluating one or more assertions that assert that if the particular state occurs in the instantiation of the hardware design that it does not occur again within a predetermined number of clock cycles to determine whether the instantiation of the hardware design is in a livelock including the particular state.

The monitor and detection logic 308 comprises state detection logic 314 for detecting when the instantiation of the hardware design 102 is in a particular state and a state register 316 for storing the results of the detection. The state detection logic 314 is configured to monitor one or more control signals and/or data signals of the instantiation of the hardware design 102 to detect when the instantiation of the hardware design 102 is in a particular state. The specific control signals and/or data signals that are monitored, and the status thereof indicating the particular state has occurred in the instantiation of the hardware design 102 will vary depending on the particular state being detected and the configuration of the instantiation of the hardware design 102.

For example, as described in more detail below, where the integrated circuit described by the hardware design forms a processor and the particular state is fetching of an instruction from a particular address, the state detection logic 314 may be configured to monitor the stage the processor is currently executing and the program counter, and detect that the particular state has occurred in the instantiation of the hardware design 102 when the processor is currently executing the fetch stage and the program counter is set to the particular address.

If the state detection logic 314 detects that the particular state has occurred in the instantiation of the hardware design 102 the state detection logic 314 may set the state register 316 to indicate that the instantiation of the hardware design was detected to be in the particular state; and if the state detection logic 314 does not detect that the particular state has occurred in the instantiation of the hardware design 102 the state detection logic 314 may clear the state register 316 to indicate that the instantiation of the hardware design was not detected to be in the particular state.

The assertion evaluation logic 310 periodically evaluates one or more formal assertions that assert a property that if a particular state occurs in the instantiation of the hardware design 102 the particular state cannot occur again in the instantiation of the hardware design within a predetermined number of clock cycles. The following is example SVA code for implementing such an assertion where state_register is the state register 316 and LOOP_FREE_CYCLES is the predetermined number of clock cycles.

```
'define clk_rst @(posedge clk) disable iff (!resetn)
assert property ('clk_rst state_register
   |=> !state_register[*LOOP_FREE_CYCLES]);
```

It will be evident to a person of skill in the art that the above SVA code states that if the predetermined state has occurred in an instantiation of the hardware design (state_register) then in the next clock cycle (|=>) and the following predetermined number of clock cycles ([*LOOP_FREE_CYCLES]) the predetermined state cannot occur in the instantiation of the hardware design (!state_register).

As described above, when a formal verification tool 112 formally verifies such an assertion it verifies that there is not a sequence of states of the instantiation of the hardware design in which the assertion is not true. In other words, the formal verification tool 112 verifies that there is not a valid sequence of states of the instantiation of the hardware design where the particular state occurs in the instantiation of the hardware design 102 two or more times within the predetermined number of clock cycles. If there is at least one valid sequence of states in which the assertion is not true then the assertion will fail and the formal verification tool 112 outputs an indication that the assertion is not true (and, possibly, an indication of the sequence of states that caused the assertion to fail).

Although, not shown in FIG. 3, it will be evident to a person of skill in the art that the logic blocks (e.g. state detection logic 314, and assertion evaluation logic 310) may be triggered by a clock. For example, one or more of the logic blocks may be triggered by the rising or positive edge of the clock. Furthermore, it will be evident to a person of skill in the art that one or more of the logic blocks (e.g. state detection logic 314, and assertion evaluation logic 310) may be combined or their functionality may divided between logic blocks in another manner.

Figure 4:
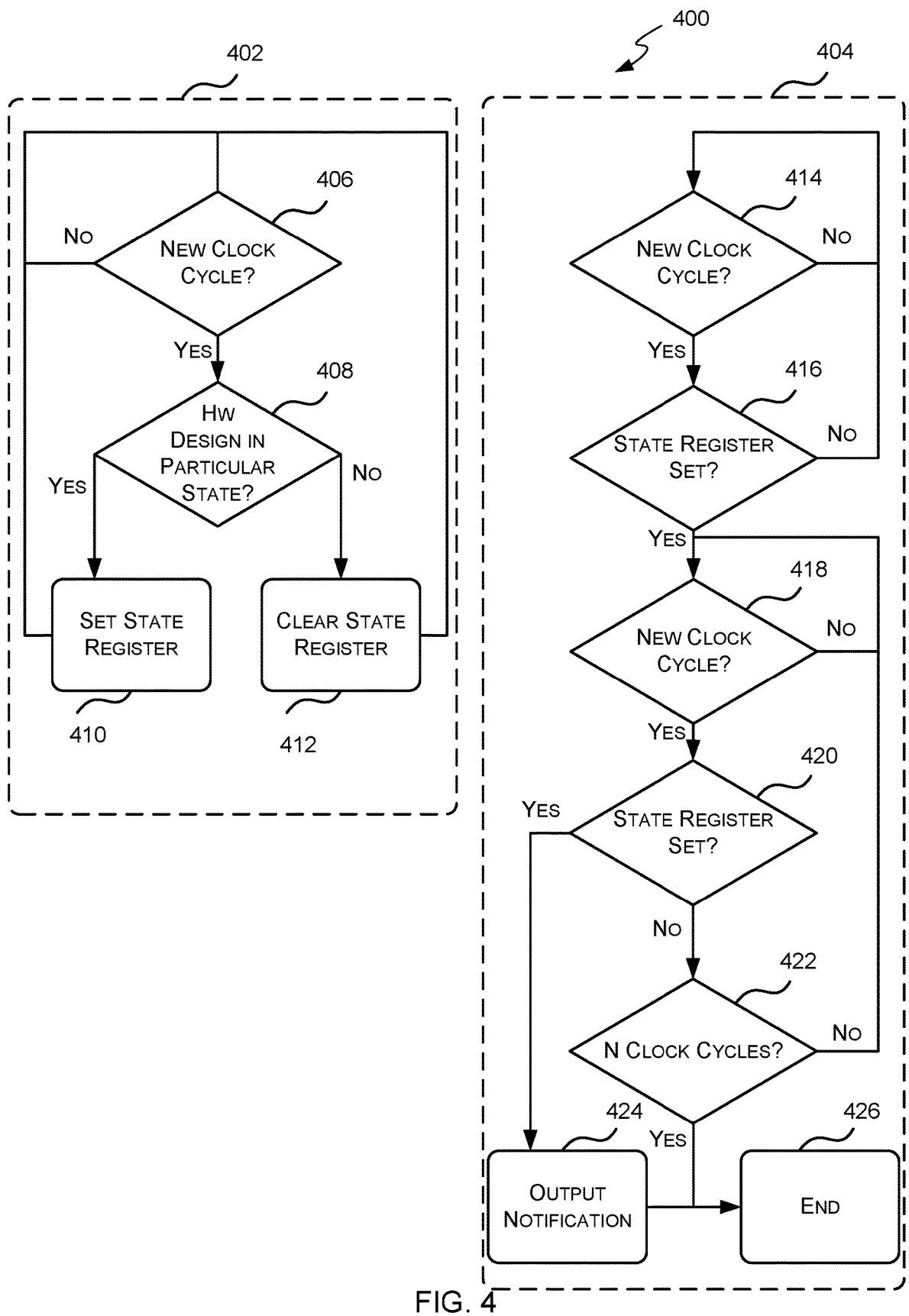
FIG. 4 is a flow diagram of an example method for detecting livelock in a hardware design using the hardware monitor of FIG. 3.

Reference is now made to FIG. 4 which illustrates an example method 400 for detecting livelock in a hardware design 102 which may be implemented by the hardware monitor 300 of FIG. 3. The method 400 detects livelock in a hardware design by determining whether a particular state occurs in an instantiation of the hardware design 102 at least twice within a predetermined number of clock cycles. The method 400 is divided into two sub-processes 402 and 404 that are executed concurrently.

In the first process 402, the state detection logic 314 is triggered each clock cycle (block 406) to determine whether the particular state has occurred in the instantiation of the hardware design 102 in the current clock cycle (block 408). As described above, the state detection logic 314 may be configured to detect whether the particular state has occurred in the instantiation of the hardware design in the current clock cycle based on the status of one or more control signals and/or data signals of the instantiation of the hardware design 102. The specific control signals and/or data signals and the status thereof that indicate the instantiation of the hardware design 102 is in the particular state depends on the particular state being monitored and the configuration of the instantiation of the hardware design 102.

If the state detection logic 314 determines that the particular state has occurred in the instantiation of the hardware design 102 in the current clock cycle then the state detection logic 314 sets the state register 316 to indicate that the instantiation of the hardware design was detected to be in the particular state (block 410). If, however, the state detection logic 314 determines that the particular state has not occurred in the instantiation of the hardware design in the current clock cycle then the state detection logic 314 clears the state register 316 to indicate that the instantiation of the hardware design 102 was not detected to be in the particular state (block 412).

In the second process 404, the assertion evaluation logic 310 is triggered each clock cycle (block 414) to determine whether the particular state has occurred in the instantiation of the hardware design 102 based on the status of the state register 316 (block 416). If the assertion evaluation logic 310 determines, based on the state register 316, that the particular state has occurred in the instantiation of the hardware design 102 then the assertion evaluation logic 310 checks (using the state register 316) each of the next N clock cycles (where N is the predetermined number of clock cycles) to see if the particular state reoccurs in the instantiation of the hardware design 102 (blocks 418, 420, 422).

If the assertion evaluation logic 310 determines, based on the state register 316, that the particular state occurs in the instantiation of the hardware design 102 in any of the next N clock cycles, the assertion evaluation logic 310 outputs a notification (block 424) indicating that the assertion has failed. This indicates that the instantiation of the hardware design 102 is not operating as expected and may be in livelock. If, however, the assertion evaluation logic 310 determines, based on the state register 316, that the particular state does not reoccur in the instantiation of the hardware design 102 in the next N clock cycles then the instantiation of the hardware design 102 is operating as expected and the process 404 ends (block 426).

In the method 400 of FIG. 4 both processes 402 and 404 are triggered each clock cycle. In some cases the processes 402 and 404 may be triggered by the rising or positive edge of a clock or the falling or negative edge of a clock. In other examples the processes 402 and 404 may be triggered by another event.

Figure 5:
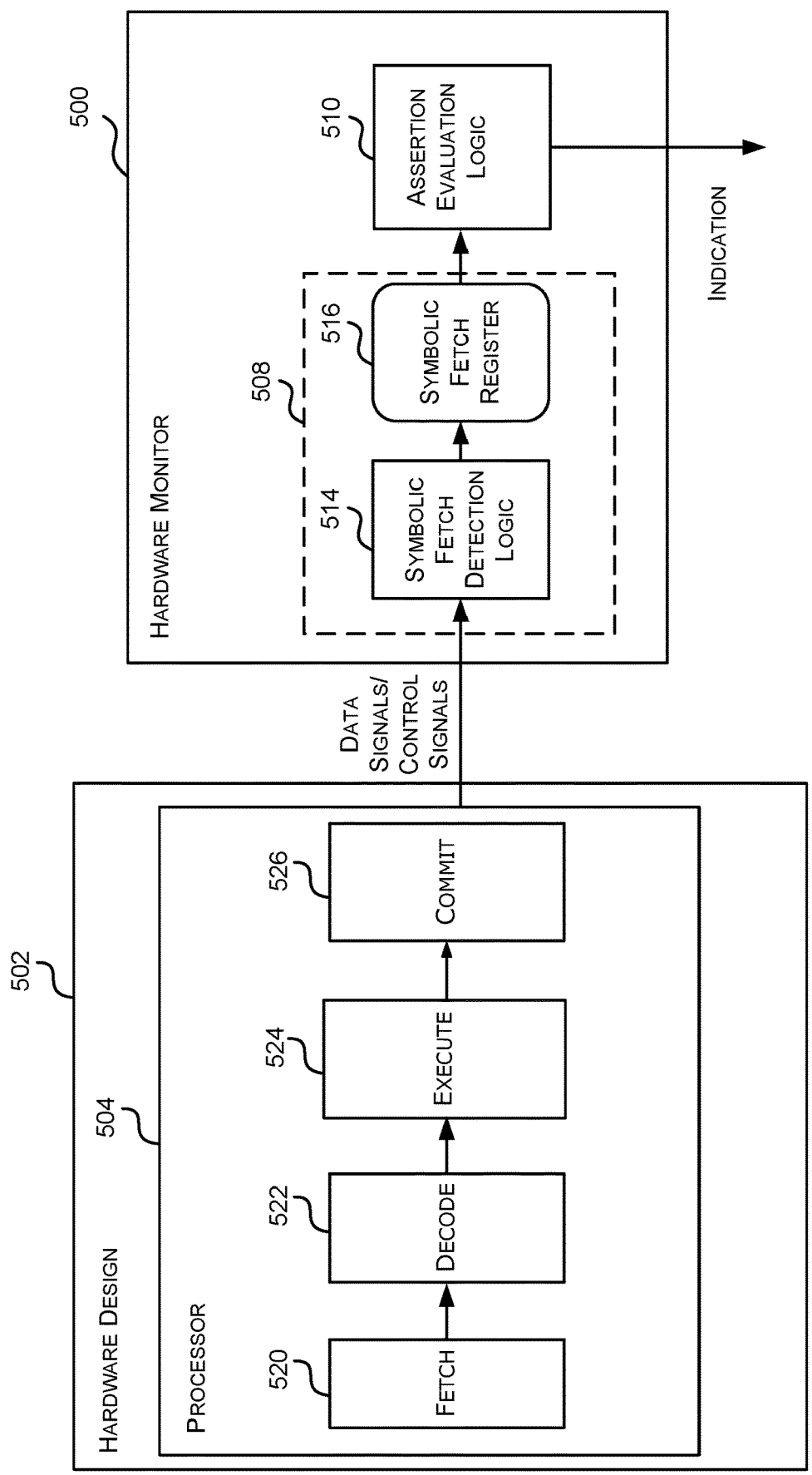
FIG. 5 is a block diagram of a second example implementation of the hardware monitor of FIG. 1 for detecting livelock in a hardware design for a processor.

Reference is now made to FIG. 5 which illustrates a second example implementation of a hardware monitor 500, which may be used as hardware monitor 106 of FIG. 1, for detecting livelock in a hardware design 502. The hardware monitor 500 of FIG. 5 detects livelock in a hardware design for a processor 504 by detecting whether the processor 504 can fetch an instruction from the same address two or more times within a predetermined number of clock cycles. Such a hardware monitor 500 is efficient in detecting an instruction in the program executed by the processor that cause loops back to itself.

As is known to those of a skill in the art, a processor fetches 520 instructions from a program, decodes 522 the fetched instructions, executes 524 the decoded instructions, and stores/commits 526 the results of the executed instructions in memory and/or registers. The processor 504 may be any processor capable of executing instructions. For example, the processor 504 may be a pipelined or un-pipelined processor, a single-threaded or multi-threaded processor, an in-order or out-of-order processor or any combination thereof.

The hardware monitor 500 comprises monitor and detection logic 508 for detecting when a particular state has occurred in the instantiation of the hardware design 502 (i.e. the processor has fetched an instruction from a particular address); and assertion evaluation logic 510 for evaluating one or more assertions that assert a property related to the reoccurrence of the particular state (i.e. the processor has fetched an instruction from a particular address) to determine whether the instantiation of the hardware design 502 is in a livelock including the particular state.

The monitor and detection logic 508 comprises symbolic fetch detection logic 514 for detecting when the processor 504 has fetched an instruction from a symbolic address, and a symbolic fetch register 516 for storing the results of the detection. The symbolic fetch detection logic 514 is configured to monitor one or more control signals and/or data signals of the processor 504 to detect when the processor 504 has fetched an instruction from the symbolic address.

As is known to those of skill in the art a symbolic variable is a variable that represents a set of, or a plurality of values (also referred to as scalar values). In this example the symbolic address represents all possible instruction addresses. Accordingly, instead of listing each possible value one at a time, a symbolic variable allows a plurality of values to be represented at once. This may allow the state space to be traversed more efficiently during formal verification by allowing the formal verification tool 112 to consider a number of states at a single step.

The specific control signals and/or data signals that will be monitored by the symbolic fetch detection logic 514 and the status thereof that indicate the processor 504 has fetched the symbolic address will vary depending on the configuration of the processor 504. For example, where the processor 504 is a single-threaded, in-order, non-pipelined processor which executes one instruction at a time the symbolic fetch detection logic 514 may be configured to detect that the instantiation of the hardware design 502 has fetched an instruction from the symbolic address when the processor 504 is currently fetching 520 an instruction and the program counter is set to the particular address. However, the symbolic fetch detection logic 514 may be configured to detect that the processor has fetched an instruction from a symbolic address in another manner.

If the symbolic fetch detection logic 514 detects that the processor 504 has fetched an instruction from the symbolic address then the symbolic fetch detection logic 514 may set the symbolic fetch register 516 to indicate that the processor 504 fetched an instruction from the symbolic address; and if the symbolic fetch detection logic 514 does not detect that the processor 504 has fetched an instruction from the symbolic address the symbolic fetch detection logic 514 may clear the symbolic fetch register 516 to indicate that the processor did not fetch an instruction from the symbolic address.

The assertion evaluation logic 510 periodically evaluates one or more formal assertions that assess the rate at which the processor fetches an instruction from the symbolic address to determine whether the processor 504 is in livelock. For example, the assertion evaluation logic 510 may periodically evaluate a formal assertion that states if the processor has fetched an instruction from the symbolic address then it cannot fetch an instruction from the symbolic address again within a predetermined number of clock cycles.

The following is example SVA code for implementing such an assertion where symbolic_fetch_register is the symbolic fetch register 516 and LOOP_FREE CYCLES is the predetermined number of clock cycles.

```
`define clk_rst @(posedge clk) disable iff (!resetn)
assert property (`clk_rst symbolic_fetch_register
 |=> !symbolic_fetch_register[*LOOP_FREE_CYCLES]);
```

It will be evident to a person of skill in the art that the above SVA code states that if the processor has fetched an instruction from the symbolic address (symbolic_fetch_register) then in the next clock cycle (|=>) and the following predetermined number of clock cycles ([*LOOP_FREE_CYCLES]) the processor cannot fetch an instruction from the symbolic address (!symbolic_fetch_register).

When a formal verification tool 112 formally verifies an assertion, such as the above assertion, that relates to a symbolic variable (e.g. symbolic address) it verifies the assertion for each valid value of the symbolic variable (as defined by formal constraints). Specifically, in this case the formal verification tool 112 formally verifies that the assertion holds or is true for all valid symbolic addresses.

Verification of the above assertion for a specific symbolic address comprises verifying that there is not a sequence of states of the hardware design 502 (e.g. processor 504 defined thereby) in which the assertion is not true. In other words the formal verification tool verifies that there is not a valid sequence of states of the hardware design 502 (e.g. processor 504 defined thereby) where the processor 504 fetches an instruction from the specific symbolic address at least twice within the predetermined number of clock cycles. If there is at least one valid sequence of states of the processor 504 in which the assertion is not true then the assertion will fail and the formal verification tool 112 may output an indication that the assertion is not true.

Accordingly, formal verification of the above assertion can be used to verify that the processor will not fetch an instruction from any valid address twice within a predetermined number of clock cycles.

During formal verification of an assertion the formal verification tool 112 typically stops the verification as soon as it finds a state or sequence of states in which the assertion fails (e.g. a sequence of states in which the an instruction is fetched from the symbolic address twice within the predetermined number of clock cycles). Accordingly, the formal verification tool 112 typically only provides information on the one state or sequence of states it identified in which the assertion is not true.

Therefore, in some cases, to get more granular feedback (or information) from the formal verification tool 112, the assertion evaluation logic 510 may be configured to evaluate a plurality of assertions which each assert that the property (e.g. an instruction cannot be fetched from a symbolic address twice within a predetermined number of clock cycles) must be true when the fetched instruction is a particular instruction (e.g. an instruction with a particular operational code (opcode)). The formal verification tool 112 will then formally verify each assertion and provide feedback if any of the assertions fail. This allows the developer or engineer of the hardware design 502 to know which types of instructions are problematic (e.g. which instructions may be causing livelock).

The following is example SVA code for implementing an assertion for each possible opcode that asserts that when the opcode of the instruction fetched from the symbolic address is the particular opcode that an instruction from the symbolic address cannot be fetched again within the predetermined number of clock cycles. In this example symbolic_address_set_new_fetch is the symbolic fetch register 516, decode_symbolic_instruction is true when the processor 504 is decoding an instruction, symbolic_instruction is the opcode of the decoded instruction, and NUM_INSTRUCTIONS is the number of different opcodes.

```
as_livelock_check:
  generate for (i=0;i<NUM_INSTRUCTIONS;i++) begin
    assert property
    (symbolic_address_set_for_new_fetch
      ##DECODE_LATENCY
      decode_symbolic_instruction &&
      (symbolic_instruction == i) |->
      !symbolic_address_set_for_new_fetch[*LOOP_FREE_
      CYCLES]);
  end
endgenerate
```

It will be evident to a person of skill in the art that the above SVA code causes NUM_INSTRUCTIONS assertions to be generated and evaluated. Each assertion asserts that when an instruction is fetched from the symbolic address (symbolic_address_set_for_new_fetch) and that instruction is decoded to have a particular opcode ((##DECODE_LATENCY decode_symbolic_instruction && (symbolic_instruction==i)) then in the current clock cycle (|->) and the following predetermined number of clock cycles ([*LOOP_FREE_CYCLES]) the processor cannot fetch an instruction from the symbolic address (symbolic_address_set_for_new_fetch).

Formal verification of such a set of assertions can be used to not only verify that the processor does not loop back to any instruction within a predetermined number of clock cycles, but, it also can provide granular feedback of which types of instructions may cause livelock.

Although, not shown in FIG. 5, it will be evident to a person of skill in the art that the logic blocks (e.g. symbolic fetch detection logic 514, and assertion evaluation logic 510) may be triggered by a clock. For example, one or more of the logic blocks may be triggered by the rising or positive edge of the clock. Furthermore, it will be evident to a person of skill in the art that one or more of the logic blocks (e.g. symbolic fetch detection logic 514, and assertion evaluation logic 510) may be combined or their functionality may divided between logic blocks in another manner.

Figure 6:
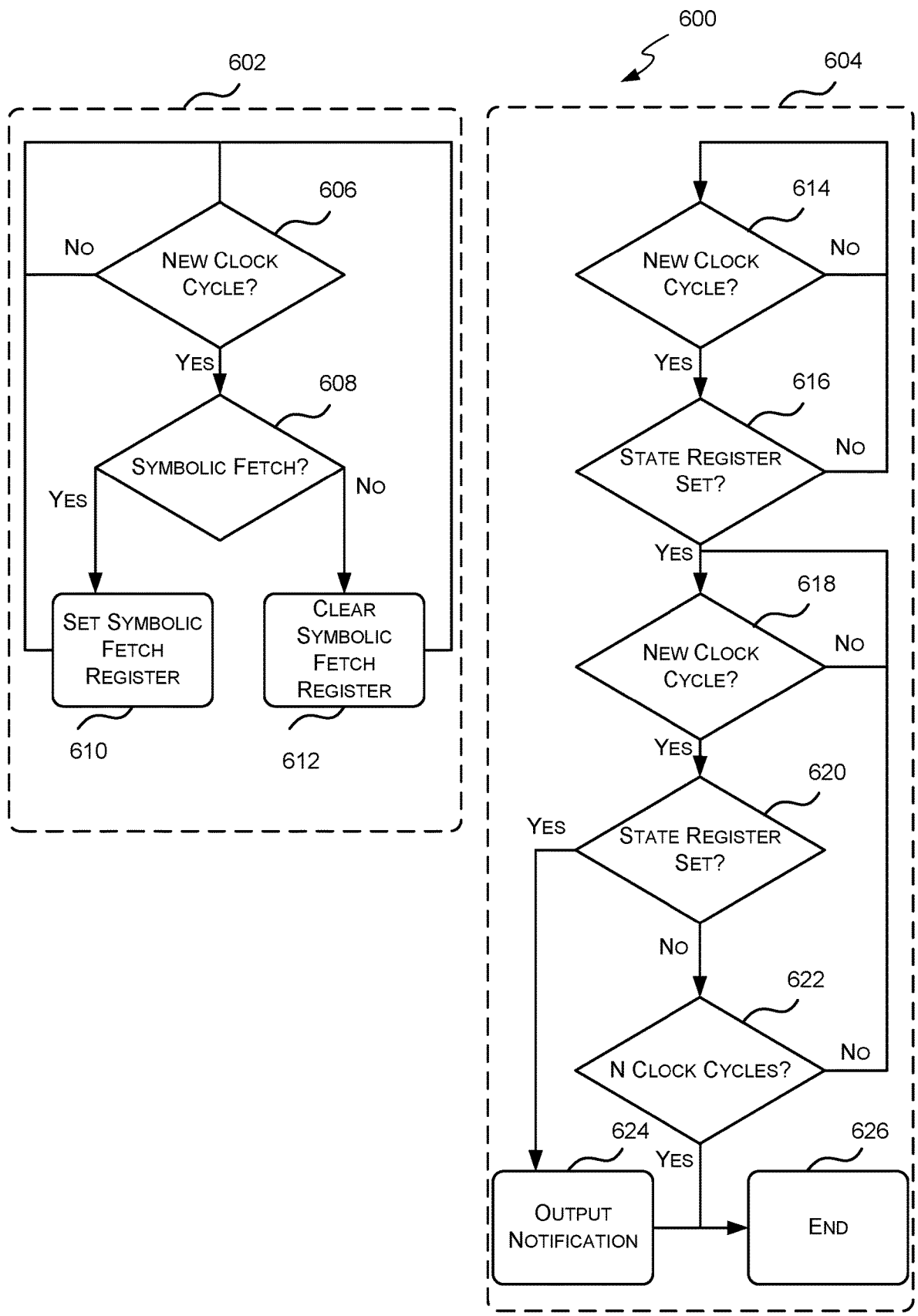
FIG. 6 is a flow diagram of an example method for detecting livelock in a hardware design for a processor using the hardware monitor of FIG. 5.

Reference is now made to FIG. 6 which illustrates an example method 600 for detecting livelock in a hardware design which may be implemented by the hardware monitor 500 of FIG. 5. The method 600 detects livelock in a hardware design 502 for a processor 504 by determining whether the processor can fetch an instruction from the same address at least twice within a predetermined number of clock cycles. The method 600 is divided into two sub-processes 602 and 604 that are executed concurrently.

In the first process 602, the symbolic fetch detection logic 514 is triggered each clock cycle (block 606) to determine whether the processor 504 has fetched an instruction from the symbolic address (block 608). As described above, the symbolic fetch detection logic 514 may, for example, be configured to detect that the processor 504 has fetched an instruction from the symbolic address if the processor 504 is in the fetch stage 520 and the program counter is set to the symbolic address.

If the symbolic fetch detection logic 514 determines that the processor has fetched an instruction from the symbolic address then the symbolic fetch detection logic 514 sets the symbolic fetch register 516 to indicate that the processor fetched an instruction from the symbolic address (block 610). If, however, the symbolic fetch detection logic 514 determines that the processor 504 did not fetch an instruction from the symbolic address then the symbolic fetch detection logic 514 clears the symbolic fetch register 516 to indicate that the processor 504 did not fetch an instruction from the symbolic address (block 612).

In the second process 604, the assertion evaluation logic 510 is triggered each clock cycle (block 614) to determine whether the processor 504 has fetched an instruction from the symbolic address based on the status of the symbolic fetch register 516 (block 616). If the assertion evaluation logic 510 determines, based on the symbolic fetch register 516, that the processor 504 fetched an instruction from the symbolic address then the assertion evaluation logic 510 determines (using the symbolic fetch register 516) whether the processor fetches an instruction from the symbolic address in any of the next N clock cycles (where N is the predetermined number of clock cycles) (blocks 618, 620, 622).

If the assertion evaluation logic 510 determines, based on the symbolic fetch register 516, that the processor fetches an instruction from the symbolic address in at least one of the next N clock cycles, the assertion evaluation logic 510 outputs a notification (block 624) indicating that the assertion has failed. This indicates that the processor 504 is not operating as expected and may be in a livelock. If, however, the assertion evaluation logic 510 determines, based on the symbolic fetch register 516, that the processor does not fetch an instruction from the symbolic address again in the next N clock cycles then the processor 504 is operating as expected and the process 604 ends (block 626).

In the method 600 of FIG. 6 both processes 602 and 604 are triggered each clock cycle. In some cases the processes 602 and 604 may be triggered by the rising or positive edge of a clock or the falling or negative edge of a clock. In other examples the processes 602 and 604 may be triggered by another event.

Figure 7:
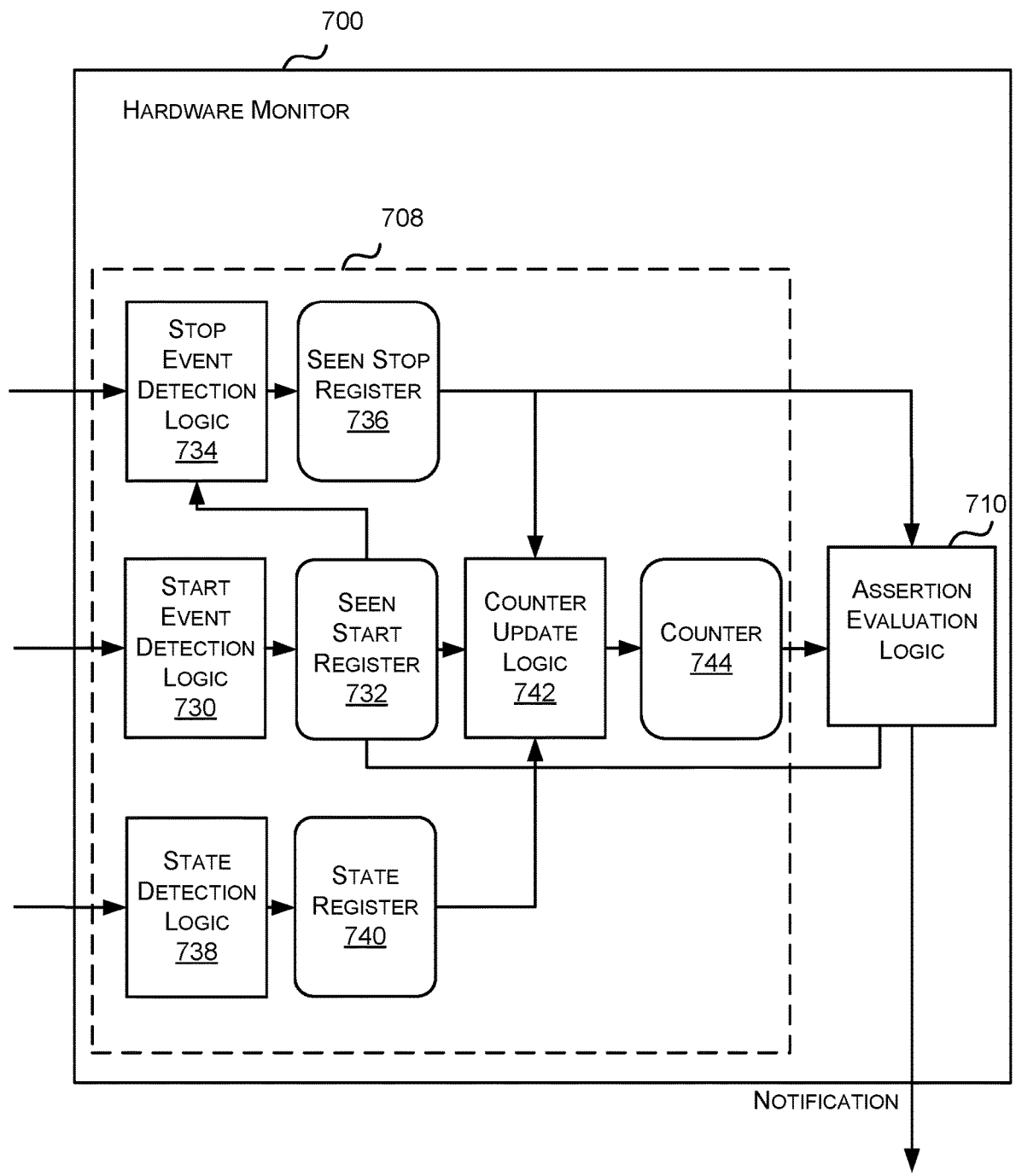
FIG. 7 is a block diagram of a third example implementation of the hardware monitor of FIG. 1 for detecting livelock in a hardware design.

Reference is now made to FIG. 7 which illustrates a third example implementation of a hardware monitor 700, which may be used as hardware monitor 106 of FIG. 1, for detecting livelock in a hardware design 102. In this example the hardware monitor 700 detects that an instantiation of the hardware design 102 is in livelock by detecting whether a particular state occurs in the instantiation of the hardware design more than an acceptable number of times between a start event and a stop event. The hardware monitor 700 of FIG. 7 may be particularly useful in detecting livelock in a hardware design where a recovery mechanism has been implemented in the integrated circuit so that it should not repeat the same state more than a predetermined number of times before returning to a safe state (e.g. idle).

The hardware monitor 700 comprises monitor and detection logic 708 for counting the number of times the particular state occurs in the instantiation of the hardware design 102 between the stop and start event, and assertion evaluation logic 710 for evaluating an assertion that states that the count must be less than a predetermined number.

The monitor and detection logic 708 comprises start event detection logic 730 for detecting that the start event has occurred and a seen start register 732 for storing the results of the detection; stop event detection logic 734 for detecting that the stop event has occurred and a seen stop register 736 for storing the results of the detection; state detection logic 738 for detecting that the particular state has occurred in the instantiation of the hardware design 102 and a state register 740 for storing the results of the detection; and counter update logic 742 for storing in a counter 744 the number of times the particular state occurs in the instantiation of the hardware design 102 between the start event and the stop event.

The start event detection logic 730 is configured to monitor one or more control signals and/or data signals of the instantiation of the hardware design 102 to detect when a start event has occurred. The specific control signals and/or data signals and the status thereof that indicate a particular start event has occurred depends on the start event and the configuration of the instantiation of the hardware design 102. In some cases, when the hardware design 102 is for a processor, the start event may be when the processor is in an idle state. When the start event detection logic 730 detects the start event the start event detection logic 730 sets a seen start register 732 to indicate that the start event has been detected.

The stop event detection logic 734 is configured to monitor one or more control signals and/or data signals of the instantiation of the hardware design 102 to detect when a stop event has occurred. The specific control signals and/or data signals and the status thereof that indicate a particular stop event has occurred depends on the particular stop event and the configuration of the instantiation of the hardware design 102. In some cases, when the hardware design 102 describes a processor, the stop event may be when the processor is in an idle state. When the stop event detection logic 734 detects the stop event the stop event detection logic 734 sets a seen stop register 736 to indicate that the stop event has been detected.

In some cases, the stop event detection logic 734 is configured to only set the seen stop register 736 if the stop event is detected and the start event has already been detected. The stop event detection logic 734 may be configured to determine that the start event has been detected based on the status of the seen start register 732. Accordingly, in some cases, the stop event detection logic 734 may be configured to only set the seen stop register 736 if the seen start register 732 is set and the stop event is detected.

The state detection logic 738 is configured to monitor one or more control signals and/or data signals of the instantiation of the hardware design 102 to detect when the particular state occurs in the instantiation of the hardware design 102.

The specific control signals and/or data signals that are monitored, and the status thereof indicating the instantiation of the hardware design 102 is in the particular state will vary depending on the particular state being detected and the configuration of the instantiation of the hardware design 102.

If the state detection logic 738 detects that the particular state has occurred in the instantiation of the hardware design 102 in the current clock cycle the state detection logic 738 may set the state register 740 to indicate that the instantiation of the hardware design 102 was detected to be in the particular state; and if the state detection logic 738 does not detect that the particular state has occurred in the instantiation of the hardware design in the current clock cycle the state detection logic 738 may clear the state register 740 to indicate that the instantiation of the hardware design 102 was not detected to be in the particular state.

The counter update logic 742 is configured to count the number of times the particular state has occurred in the instantiation of the hardware design 102 between the start event and the stop event. In other words, the counter update logic 742 counts the number of times the instantiation of the hardware design 102 repeats the particular state between the start event and the stop event.

The counter update logic 742 may be configured to, each clock cycle, determine whether the start event has been detected (e.g. from the state of the seen start register 732), the stop event has not been detected (e.g. from the state of the seen stop register 736), and the particular state has occurred in the instantiation of the hardware design (e.g. from the state register 740). If the counter update logic 742 determines that the start event has been detected, the stop event has not been detected, and the particular state has occurred in the instantiation of the hardware design 102 then the counter update logic 742 may increment a counter 744. Otherwise the counter update logic 742 does not increment the counter 744. In this way the counter update logic 742, in conjunction with the counter 744, counts the number of times the particular state occurs between the start event and the stop event.

The assertion evaluation logic 710 periodically evaluates (e.g. each clock cycle) one or more assertions related to the counter 744 value to determine whether the instantiation of the hardware design 102 is in livelock. In some examples the assertion evaluation logic 710 may be configured to verify an assertion that between the start event and stop event the counter 744 is less than a predetermined number. The following is example SVA code for implementing such an assertion where counter is the counter 744, N is the predetermined number, seenstart is the seen start register 732, and seenstop is the seen stop register 736.

```
'define clk_rst @(posedge clk) disable iff (!resetn)
assert property ('clk_rst seenstart && !seenstop ->
    counter < N);
```

It will be evident to a person of skill in the art that the above SVA code states that if the start event has occurred (seenstart) and the stop event has not occurred (!seenstop) then the counter (counter) must be less than the predetermined number (<N). When the formal verification tool 112 formally verifies such an assertion it will verify that there is not a valid sequence of states of the instantiation of the hardware design 102 in which the assertion is not true. In other words the formal verification tool 112 formally verifies that there is not a sequence of states when the particular state will occur N or more times between the start and stop event.

Although, not shown in FIG. 7, it will be evident to a person of skill in the art that the logic blocks (e.g. start event detection logic 730, stop event detection logic 734, state detection logic 738, counter update logic 742, and assertion evaluation logic 710) may be triggered by a clock. For example, one or more of the logic blocks may be triggered by the rising or positive edge of the clock. Furthermore, it will be evident to a person of skill in the art that one or more of the logic blocks (e.g. start event detection logic 730, stop event detection logic 734, state detection logic 738, counter update logic 742, and assertion evaluation logic 710) may be combined or their functionality may divided between logic blocks in another manner.

Figure 8:
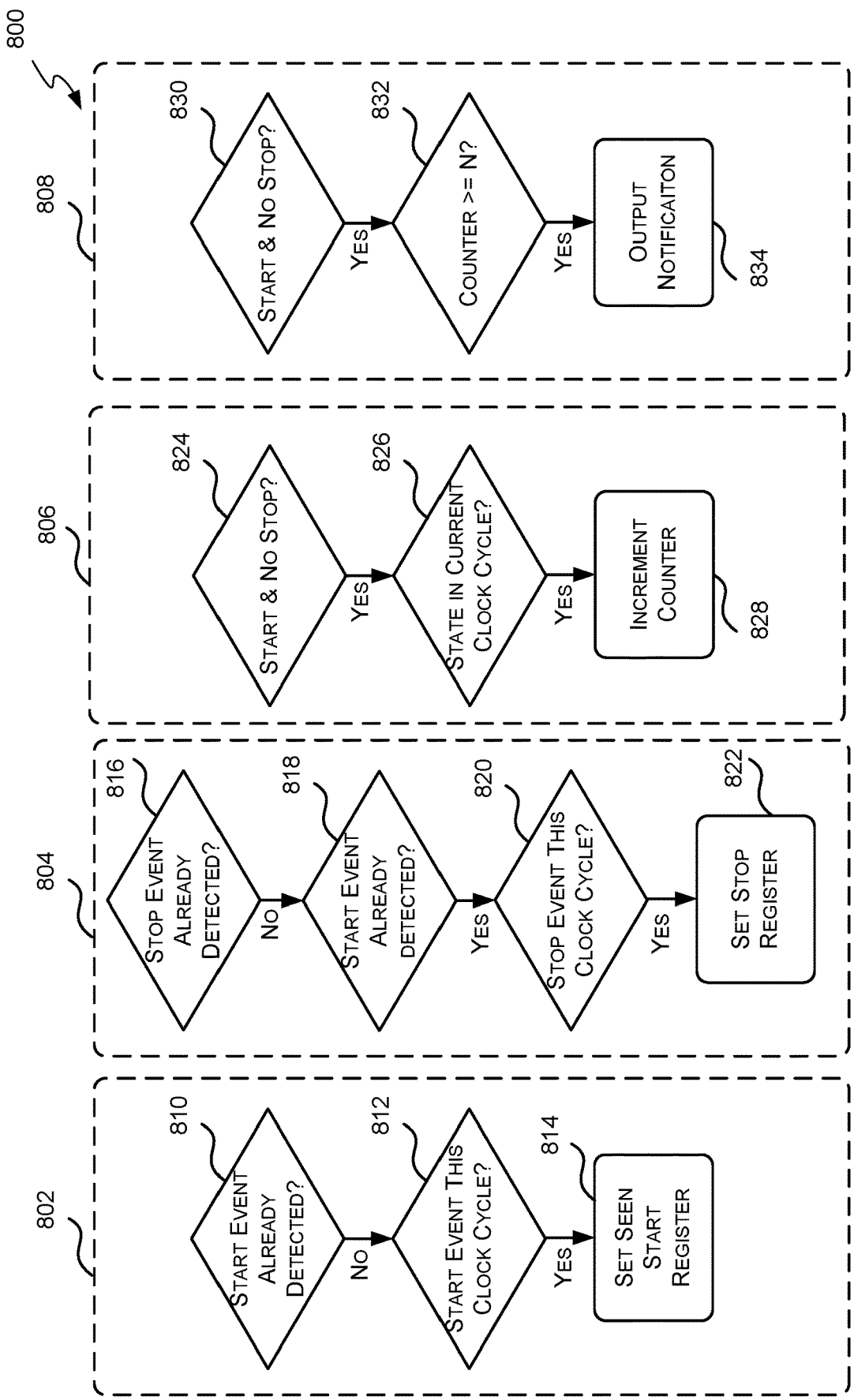
FIG. 8 is a flow diagram of an example method for detecting livelock in a hardware design using the hardware monitor of FIG. 7.

Reference is now made to FIG. 8 which illustrates an example method 800 for detecting livelock in a hardware design 102 which may be executed by the hardware monitor 700 of FIG. 7 each clock cycle. The method 800 is divided into four separate processes 802, 804, 806, and 808 which are executed concurrently.

In the first process 802, the start event detection logic 730 determines whether the start event has already been detected (e.g. from the seen start register 732) (block 810). If the start event has not already been detected then the start event detection logic 730 determines whether the start event has occurred in the current clock cycle (block 812). As described above, the start event detection logic 730 may, for example, be configured to detect that the start event has occurred when one or more control signals and data signals of an instantiation of the hardware design 102 has/have a certain status. If the start event detection logic 730 determines that the start event has occurred in the current clock cycle then the seen start register 732 is set (block 814).

In the second process 804, the stop event detection logic 734 determines whether the stop event has already occurred (e.g. from the seen stop register 736) (block 816). If the stop event has not already been detected then the stop event detection logic 734 determines whether the start event has already occurred (e.g. from the seen start register 732) (block 818). If the stop event detection logic 734 determines that the start event has already been detected then the stop event detection logic 734 determines whether the stop event has occurred in the current clock cycle (block 820). As described above, the stop event detection logic 734 may, for example, be configured to detect that the stop event has occurred when one or more control signals and/or data signals of the instantiation of the hardware design 102 has/have a certain status. If the stop event detection logic 734 determines that the stop event has occurred in the current clock cycle then the seen stop register 736 is set (block 822).

In the third process 806, the counter update logic 742 determines whether the start event has already been detected (e.g. from the seen start register 732) and the stop event has not already been detected (e.g. from the seen stop register 736) (block 824). If the start event has been detected then the counter update logic 742 determines whether the particular state has occurred in the current clock cycle (e.g. from the state register 740—which is set by the state detection logic 738 when the particular state has been detected) (block 826). If the counter update logic 742 determines that the particular state has occurred in the current clock cycle then the counter 744 is incremented to indicate that the particular state has occurred an additional time between the start event and the stop event (block 828).

In the fourth process 808, the assertion evaluation logic 710 determines whether the start event has already been detected (e.g. from the seen start register 732) and the stop event has not already been detected (e.g. from the seen stop register 736) (block 830). If the start event has been detected then the counter update logic 742 determines whether the counter 744 is equal to or greater than a predetermined number (N) (block 832). If the counter 744 is equal to or greater than the predetermined number then the particular state has occurred too many times which indicates that the instantiation of the hardware design may be in livelock so the assertion evaluation logic 710 outputs a notification that an error has been detected (block 834).

Although the above examples describe using a hardware monitor 106, 300, 500, or 700 to detect livelock in a hardware design 102 or 502 by formally verifying the assertion(s) defined in the hardware monitor 106, 300, 500 or 700 using a formal verification tool 112, in other examples the hardware monitor 106, 300, 500 or 700 (including the assertion(s) defined therein) may be synthesised into hardware (e.g. an integrated circuit) as part of, or in connection with, an instantiation of the hardware design 102 or 502. In these examples the assertion(s) of the hardware monitor 106, 300, 500 or 700 act as a monitor during operation of the hardware. In particular, during operation of the hardware (e.g. integrated circuit) the hardware monitor 106, 300, 500 or 700 periodically evaluates the assertion(s) (e.g. upon the positive edge of the clock signal).

When the hardware monitor 106, 300, 500 or 700 is implemented in hardware any symbolic variable is typically implemented by a register which has a fixed value during operation. The fixed value may be randomly assigned each time the hardware monitor 106, 300, 500 or 700 is reset. For example, where a symbolic opcode represents the possible opcodes, after a first reset the symbolic opcode may be assigned opcode 0 and after a second reset the symbolic opcode may be assigned opcode 3. Accordingly, after the first reset, the hardware monitor 106, 300, 500, or 700 monitors instructions with opcode 0, and after the second reset, the hardware monitor 106, 300, 500 or 700 monitors instructions with opcode 3.

However, to enable such a variable to have a more useful meaning the hardware monitor 106, 300, 500 or 700 may be configured to include logic configured to (a) set a register (e.g. sampled_in) when start of the livelock test begins (e.g. when an instruction is fetched) and cleared when the livelock test is complete (e.g. when the appropriate assertion has been evaluated); and to (b) set the variable (e.g. symb) to a stable value when the register (e.g. sampled_in) is set. Example SVA code to implement this is shown below:

$stable(symb) sampled_in |→$stable(symb)

In this way, the variable (e.g. symb) will take on a fixed value when a livelock test is in progress (e.g. when the register (e.g. sampled_in) is set), but once the livelock test is complete the variable (e.g. symb) can take on a new value. This allows the variable to take on multiple values without having to be reset in-between.

If the hardware monitor 106, 300, 500 or 700 detects that an assertion has failed or is not true then the hardware monitor 106, 300, 500 or 700 may output information indicating the hardware may be in a livelock. This can improve observability by being able to identify a possible livelock as soon as it is triggered. Without such assertion(s) livelock can only be identified in simulation-based verification or during operation if it propagates to an observable output and then it is only evident at the end of the simulation. By using one or more assertions, livelock can be checked and observed instantly, at its source.

The concepts described above in the context of livelock detection, can be used to detect other errors (or "faults" or "bugs") in a hardware design. In particular, there may be provided a hardware monitor arranged to detect an error in a hardware design for an integrated circuit, the hardware monitor comprising: monitor and detection logic configured to detect an occurrence of an event which is indicative of the error in an instantiation of the hardware design; and assertion evaluation logic configured to evaluate one or more assertions that assert a formal property related to the occurrence of the event in the instantiation of the hardware design to detect the error in the instantiation of the hardware design.

Figure 9:
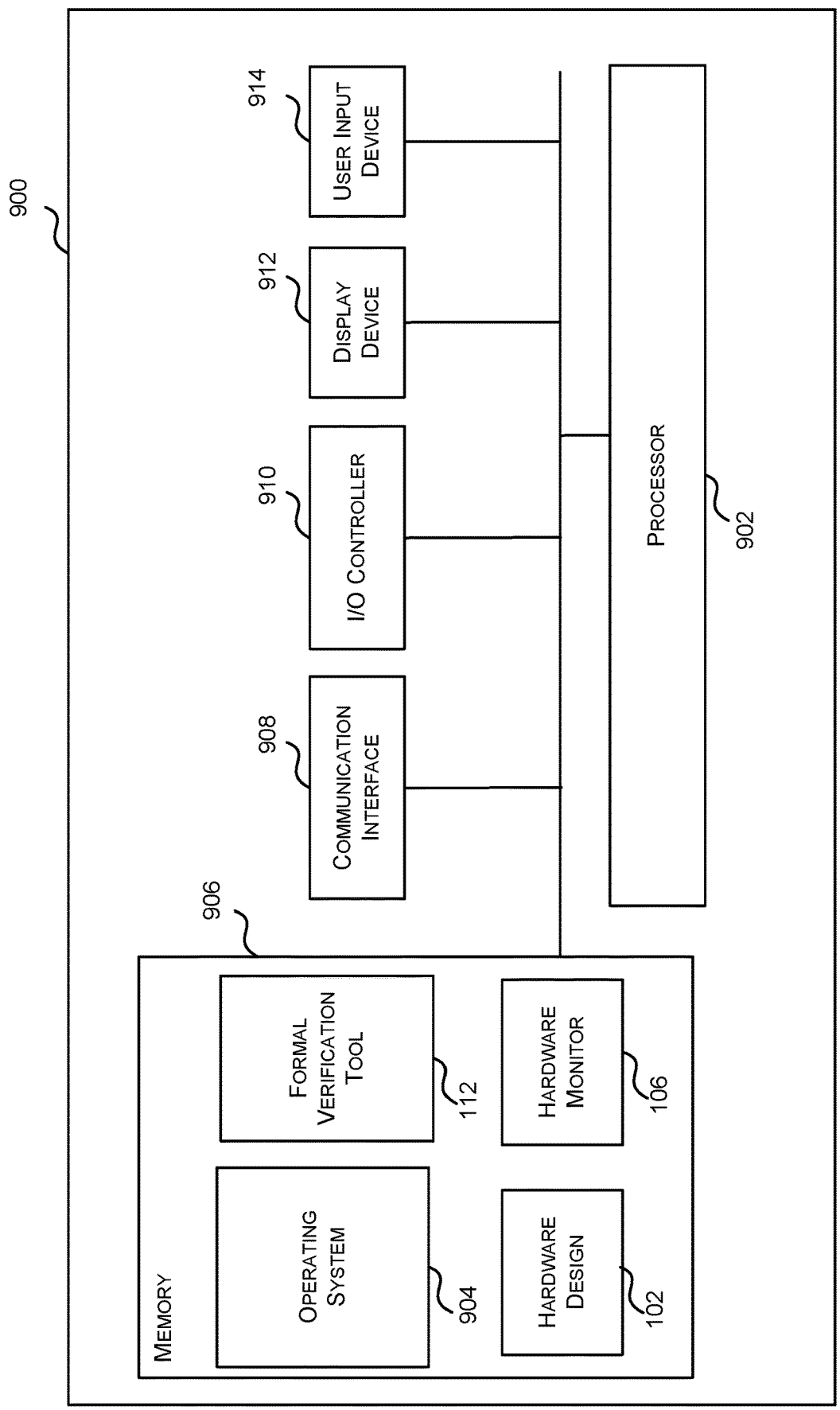
FIG. 9 is a block diagram of an example computing-based device.

FIG. 9 illustrates various components of an exemplary computing-based device 900 which may be implemented as any form of a computing and/or electronic device, and in which embodiments of the systems, methods and hardware monitors described above may be implemented.

Computing-based device 900 comprises one or more processors 902 which may be microprocessors, controllers or any other suitable type of processors for processing computer executable instructions to control the operation of the device in order to assess the performance of an integrated circuit defined by a hardware design in completing a task. In some examples, for example where a system on a chip architecture is used, the processors 902 may include one or more fixed function blocks (also referred to as accelerators) which implement a part of the method of detecting livelock in a hardware design in hardware (rather than software or firmware). Platform software comprising an operating system 904 or any other suitable platform software may be provided at the computing-based device to enable application software, such as a formal verification tool 112, to be executed on the device.

The computer executable instructions may be provided using any computer-readable media that is accessible by computing based device 900. Computer-readable media may include, for example, computer storage media such as memory 906 and communications media. Computer storage media (i.e. non-transitory machine readable media), such as memory 906, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 906) is shown within the computing-based device 900 it will be appreciated that the storage may be distributed or located remotely and accessed via a network or other communication link (e.g. using communication interface 908).

The computing-based device 900 also comprises an input/output controller 910 arranged to output display information to a display device 912 which may be separate from or integral to the computing-based device 900. The display information may provide a graphical user interface. The input/output controller 910 is also arranged to receive and process input from one or more devices, such as a user input device 914 (e.g. a mouse or a keyboard). This user input may be used to, for example, initiate formal verification of the assertions defined in the hardware monitor 106. In an embodiment the display device 912 may also act as the user input device 914 if it is a touch sensitive display device. The input/output controller 910 may also output data to devices other than the display device, e.g. a locally connected printing device (not shown in FIG. 9).

The hardware monitors of FIGS. 1, 3, 5 and 7 are shown as comprising a number of functional blocks. This is schematic only and is not intended to define a strict division between different logic elements of such entities. Each functional block may be provided in any suitable manner. It is to be understood that intermediate values described herein as being formed by a hardware monitor need not be physically generated by the hardware monitor at any point and may merely represent logical values which conveniently describe the processing performed by the hardware monitor between its input and output.

The terms computer program code and computer readable instructions as used herein refer to any kind of executable code for processors, including code expressed in a machine code language, an interpreted language or a scripting language. Executable code includes binary code, machine code, byte-code, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

As described above a hardware design, which also may be referred to herein as an integrated circuit definition data set, describes an integrated circuit to perform one or more tasks. The hardware design may be implemented in software, such as HDL (hardware description language). Accordingly, there may be provided a computer readable storage medium having encoded thereon computer readable program code in the form of an integrated circuit definition dataset (e.g. hardware design) that when processed in an integrated circuit manufacturing system configures the system to manufacture an integrated circuit to perform the one or more tasks.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture an integrated circuit will now be described with respect to FIG. 10.

Figure 10:
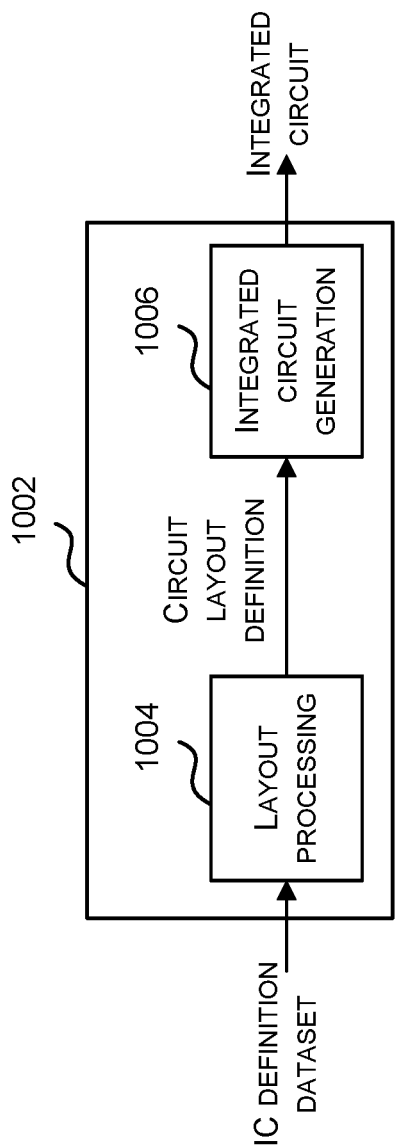
FIG. 10 is a block diagram of an example integrated circuit manufacturing system.

FIG. 10 shows an example of an integrated circuit (IC) manufacturing system 1002 which comprises a layout processing system 1004 and an integrated circuit generation system 1006. The IC manufacturing system 1002 is configured to receive an IC definition dataset (e.g. a hardware design 102 defining an integrated circuit), process the IC definition dataset, and generate an IC according to the IC definition dataset (e.g. hardware design 102). The processing of the IC definition dataset configures the IC manufacturing system 1002 to manufacture an integrated circuit to perform one or more tasks.

The layout processing system 1004 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1004 has determined the circuit layout it may output a circuit layout definition to the IC generation system 1006. A circuit layout definition may be, for example, a circuit layout description.

The IC generation system 1006 generates an IC according to the circuit layout definition, as is known in the art. For example, the IC generation system 1006 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1006 may be in the form of computer-readable code which the IC generation system 1006 can use to form a suitable mask for use in generating an IC.

The different processes performed by the IC manufacturing system 1002 may be implemented all in one location, e.g. by one party. Alternatively, the IC manufacturing system 1002 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture an integrated circuit without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some examples, an integrated circuit definition dataset could include software which runs on hardware defined at the dataset or in combination with hardware defined at the dataset. In the example shown in FIG. 10, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of detecting whether a hardware design for an integrated circuit that forms a processor can enter livelock, the method comprising:
    configuring a hardware monitor to detect when a particular state has occurred in an instantiation of the hardware design;
    configuring the hardware monitor to periodically evaluate one or more assertions to determine whether the instantiation of the hardware design is in a livelock comprising the particular state, the one or more assertions comprising an assertion that asserts that a number of occurrences of the particular state in the instantiation of the hardware design between a start event and a stop event is less than a predetermined number; and
    formally verifying, by a formal verification tool, that the one or more assertions of the hardware monitor are true for the instantiation of the hardware design to determine whether the instantiation of the hardware design can enter a livelock that includes the particular state;
    wherein the start event is when the processor is in an idle state and the stop event is when the processor is in an idle state.

2. The method of claim 1, further comprising configuring the hardware monitor to:
    monitor one or more control signals and/or data signals of the instantiation of the hardware design to detect the start event and in response to detecting the start event set a seen start register;
    monitor one or more controls signals and/or data signals of the instantiation of the hardware design to detect the stop event, and in response to detecting the stop event when the seen start register is set, set a seen stop register;
    in response to detecting the particular state has occurred in the instantiation of the hardware design, set a state register; and
    increment a counter that represents the number of occurrences of the particular state between the start event and the stop event when the seen register is set, the state register is set, and the seen stop register is not set.

3. The method of claim 2, wherein the one or more assertions comprises an assertion that asserts that when the seen start register is set and the seen stop register is not set that the counter is less than the predetermined number.

4. The method of claim 1, wherein the particular state is based on a symbolic variable, and when the one or more assertions are verified by the formal verification tool, the formal verification tool formally verifies the one or more assertions are true for the instantiation of the hardware design for each valid value of the symbolic variable.

5. The method of claim 1, further comprising outputting an indication of whether or not each of the one or more assertions was successfully verified to identify whether the instantiation of the hardware design can enter livelock that includes the particular state.

6. The method of claim 1, further comprising, when one of the one or more assertions is not successfully verified, outputting an indication of a sequence of states of the instantiation of the hardware design for which the assertion is not true.

7. The method of claim 6, further comprising, using the indication of the sequence of states of the instantiation of the hardware design for which the assertion is not true to modify the hardware design to avoid the livelock that includes the particular state.

8. The method of claim 1, wherein when the hardware design is processed in an integrated circuit manufacturing system, the hardware design configures the integrated circuit manufacturing system to manufacture the integrated circuit.

9. The method of claim 1, further comprising, in response to each of the one or more assertions being successfully verified, generating a hardware manifestation of the integrated circuit based on the hardware design.

* * * * *